(12) United States Patent
Wang et al.

(10) Patent No.: US 12,707,716 B2
(45) Date of Patent: Aug. 11, 2026

(54) SILICON-ON-INSULATOR SUBSTRATE PROCESSING FOR TRANSISTOR ENHANCEMENT

(71) Applicant: Skyworks Solutions, Inc., Irvine, CA (US)

(72) Inventors: Hailing Wang, Acton, MA (US); Guillaume Alexandre Blin, Carlisle, MA (US); David Scott Whitefield, Andover, MA (US); Paul T. DiCarlo, Marlborough, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 700 days.

(21) Appl. No.: 18/156,661

(22) Filed: Jan. 19, 2023

(65) Prior Publication Data

US 2023/0238385 A1 Jul. 27, 2023

Related U.S. Application Data

(60) Provisional application No. 63/303,728, filed on Jan. 27, 2022.

(51) Int. Cl.
*H10D 86/00* (2025.01)
*H10D 86/01* (2025.01)
*H10W 44/20* (2026.01)

(52) U.S. Cl.
CPC ........... *H10D 86/201* (2025.01); *H10D 86/01* (2025.01); *H10W 44/20* (2026.01); *H10W 44/248* (2026.01)

(58) Field of Classification Search
CPC . H01L 21/762; H01L 21/76283; H01L 23/66; H01L 2223/6677; H10D 86/00; H10D 86/01; H10D 86/201; H03K 17/10; H03K 17/102; H03K 17/122; H03K 2217/0018; H10W 44/20
See application file for complete search history.

(56) References Cited

U.S. PATENT DOCUMENTS

| | | | |
|---|---|---|---|
| 9,973,148 | B2 | 5/2018 | Zhu et al. |
| 10,014,331 | B2 | 7/2018 | Wang et al. |
| 10,389,350 | B2 | 8/2019 | Wang et al. |
| 10,410,957 | B2 | 9/2019 | Wang et al. |

(Continued)

OTHER PUBLICATIONS

Allibert et al., "Engineering SOI substrates for RF to mmWave front-ends", microwavejournal.com/articles/34713-engineering-soi-substrates-for-rf-to-mmwave-front-ends, (2020).

*Primary Examiner* — Brook Kebede
(74) *Attorney, Agent, or Firm* — Knobbe, Martens, Olson & Bear, LLP

(57) ABSTRACT

Silicon-on-insulator (SOI) substrate processing for transistor enhancement is disclosed. In certain embodiments, a silicon substrate for an SOI process is separated into sub-regions or islands by dielectric. Thus, the substrate is changed from having one region and one shared contact into multiple substrate sub-regions with independent contacts. Since the substrate serves as a back gate to SOI transistors formed in an active silicon layer, breaking the substrate into independent or separate islands leads to a drop in the impact of each island on the drain-to-source voltage and/or gate-to-source voltage of the SOI transistors. Accordingly, reduced harmonics and improved linearity are achieved.

20 Claims, 15 Drawing Sheets

(56) References Cited

U.S. PATENT DOCUMENTS

| | | | | |
|---|---|---|---|---|
| 10,431,612 | B2 | 10/2019 | Wang et al. | |
| 10,447,207 | B2 | 10/2019 | Zhu et al. | |
| 10,469,072 | B2 | 11/2019 | Wang et al. | |
| 10,498,329 | B2 | 12/2019 | Wang et al. | |
| 10,547,303 | B2 | 1/2020 | Wang et al. | |
| 10,574,227 | B2 | 2/2020 | Wang et al. | |
| 10,630,282 | B2 | 4/2020 | Wang et al. | |
| 10,630,283 | B2 | 4/2020 | Wang et al. | |
| 10,763,847 | B2 | 9/2020 | Wang et al. | |
| 10,847,445 | B2 | 11/2020 | Wang et al. | |
| 10,862,475 | B2 | 12/2020 | Wang et al. | |
| 10,886,382 | B2 | 1/2021 | Shi et al. | |
| 11,004,774 | B2 | 5/2021 | Wang et al. | |
| 11,049,890 | B2 | 6/2021 | Wang et al. | |
| 11,063,586 | B2 | 7/2021 | Wang et al. | |
| 11,418,185 | B2 | 8/2022 | Wang et al. | |
| 2012/0326230 | A1* | 12/2012 | Cheng | H10D 62/115 438/444 |
| 2014/0312461 | A1* | 10/2014 | Cheng | H01L 21/76243 257/544 |
| 2015/0325468 | A1* | 11/2015 | Zhang | H01L 21/76256 438/479 |
| 2017/0287855 | A1 | 10/2017 | Mason et al. | |
| 2017/0287935 | A1 | 10/2017 | Mason et al. | |
| 2018/0012766 | A1* | 1/2018 | Pollet | H01L 21/266 |
| 2018/0331657 | A1 | 11/2018 | Zhu et al. | |
| 2021/0005630 | A1* | 1/2021 | Hurwitz | H10D 86/201 |
| 2021/0151582 | A1 | 5/2021 | Shi et al. | |
| 2021/0265242 | A1 | 8/2021 | Wang et al. | |
| 2021/0335857 | A1 | 10/2021 | Wang et al. | |
| 2022/0254812 | A1 | 8/2022 | Wang et al. | |
| 2023/0009677 | A1 | 1/2023 | Wang et al. | |
| 2023/0084412 | A1 | 3/2023 | Wang et al. | |

* cited by examiner

70
POWER MANAGEMENT
60
VCC1
VCC2
BIAS CONTROL
61
PA
62
52
SWITCHES
51
54
RF SIGNAL

63
PA CONTROL
66
I/Q MODULATOR
67
68
ADC
69
I
Q
64
BASEBAND

100

101
102
103

101
102
103′

101
102
104
103

101
102
105
103

110
101
102
103

111
121
122
123
101
102
122

112
101
102

113
124
101
102
124

300
308
301
302
308
306
340
320
306
333
333
332

SILICON-ON-INSULATOR SUBSTRATE PROCESSING FOR TRANSISTOR ENHANCEMENT

CROSS-REFERENCE TO RELATED APPLICATIONS

This application claims the benefit of priority under 35 U.S.C. § 119 of U.S. Provisional Patent Application No. 63/303,728, filed Jan. 27, 2022 and titled "SILICON-ON-INSULATOR SUBSTRATE PROCESSING FOR TRANSISTOR ENHANCEMENT," which is herein incorporated by reference in its entirety.

BACKGROUND

Field

Embodiments of the invention relate to electronic systems, and in particular, to silicon on insulator (SOI) transistors and SOI transistor processing for radio frequency (RF) electronics.

Description of the Related Technology

Radio frequency (RF) communication systems wirelessly communicate RF signals using antennas.

Examples of RF communication systems include, but are not limited to mobile phones, tablets, base stations, network access points, laptops, and wearable electronics. RF signals have a frequency in the range from about 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a silicon-on-insulator wafer. The silicon-on-insulator wafer includes a silicon substrate broken into two or more substrate regions by a dielectric, a buried oxide layer formed over the silicon substrate, and an active silicon layer formed over the buried oxide layer and including at least one silicon-on-insulator transistor.

In various embodiments, the two or more substrate regions are islands.

In several embodiments, the dielectric is formed in a focused ion beam etched region.

In some embodiments, the dielectric is formed in a deep trench region.

In various embodiments, the at least one silicon-on-insulator transistor is arranged as a switch.

In several embodiments, only a portion of the silicon-on-insulator wafer includes the broken silicon substrate.

In some embodiments, the broken silicon substrate extends across an entirety of the silicon-on-insulator wafer.

In several embodiments, the silicon-on-insulator wafer includes two or more breaking patterns for breaking the silicon substrate.

In a number of embodiments, the silicon substrate is high resistivity.

In certain embodiments, the present disclosure relates to a packaged radio frequency module. The packaged radio frequency module includes a package substrate, and a silicon-on-insulator die attached to the package substrate. The silicon-on-insulator die includes a silicon substrate broken into two or more substrate regions by a dielectric, a buried oxide layer formed over the silicon substrate, and an active silicon layer formed over the buried oxide layer and including at least one silicon-on-insulator transistor.

In various embodiments, the two or more substrate regions are islands.

In several embodiments, the dielectric is formed in a focused ion beam etched region.

In a number of embodiments, the dielectric is formed in a deep trench region.

In some embodiments, the at least one silicon-on-insulator transistor is arranged as a switch.

In various embodiments, only a portion of the silicon-on-insulator die includes the broken silicon substrate.

In several embodiments, the broken silicon substrate extends across an entirety of the silicon-on-insulator die.

In a number of embodiments, the silicon-on-insulator die includes two or more breaking patterns for breaking the silicon substrate.

In some embodiments, the silicon substrate is high resistivity.

In certain embodiments, the present disclosure relates to a method of processing a silicon-on-insulator wafer. The method includes forming a buried oxide layer formed over a silicon substrate, forming an active silicon layer over the buried oxide layer, the active silicon layer including at least one silicon-on-insulator transistor, and breaking the silicon substrate into two or more substrate regions separated by a dielectric.

In various embodiments, the two or more substrate regions are islands.

In several embodiments, the silicon-on-insulator wafer includes two or more breaking patterns for breaking the silicon substrate.

According to a number of embodiments, the method further includes forming the at least one silicon-on-insulator transistor as a switch.

In some embodiments, only a portion of the silicon-on-insulator wafer includes the broken silicon substrate.

In various embodiments, the broken silicon substrate extends across an entirety of the silicon-on-insulator wafer.

In several embodiments, breaking the silicon substrate includes etching a bottom surface of the silicon substrate using a focused ion beam, and filling the etched silicon substrate with the dielectric.

In some embodiments, breaking the silicon substrate includes forming a plurality of deep trenches in a top surface of the silicon substrate, and filling the plurality of deep trenches with the dielectric.

In various embodiments, the method further includes forming the at least one silicon-on-insulator transistor before breaking the silicon substrate.

In several embodiments, the method further incudes forming the at least one silicon-on-insulator transistor after breaking the silicon substrate.

In some embodiments, the silicon substrate is high resistivity.

DETAILED DESCRIPTION OF EMBODIMENTS

Figure 1:
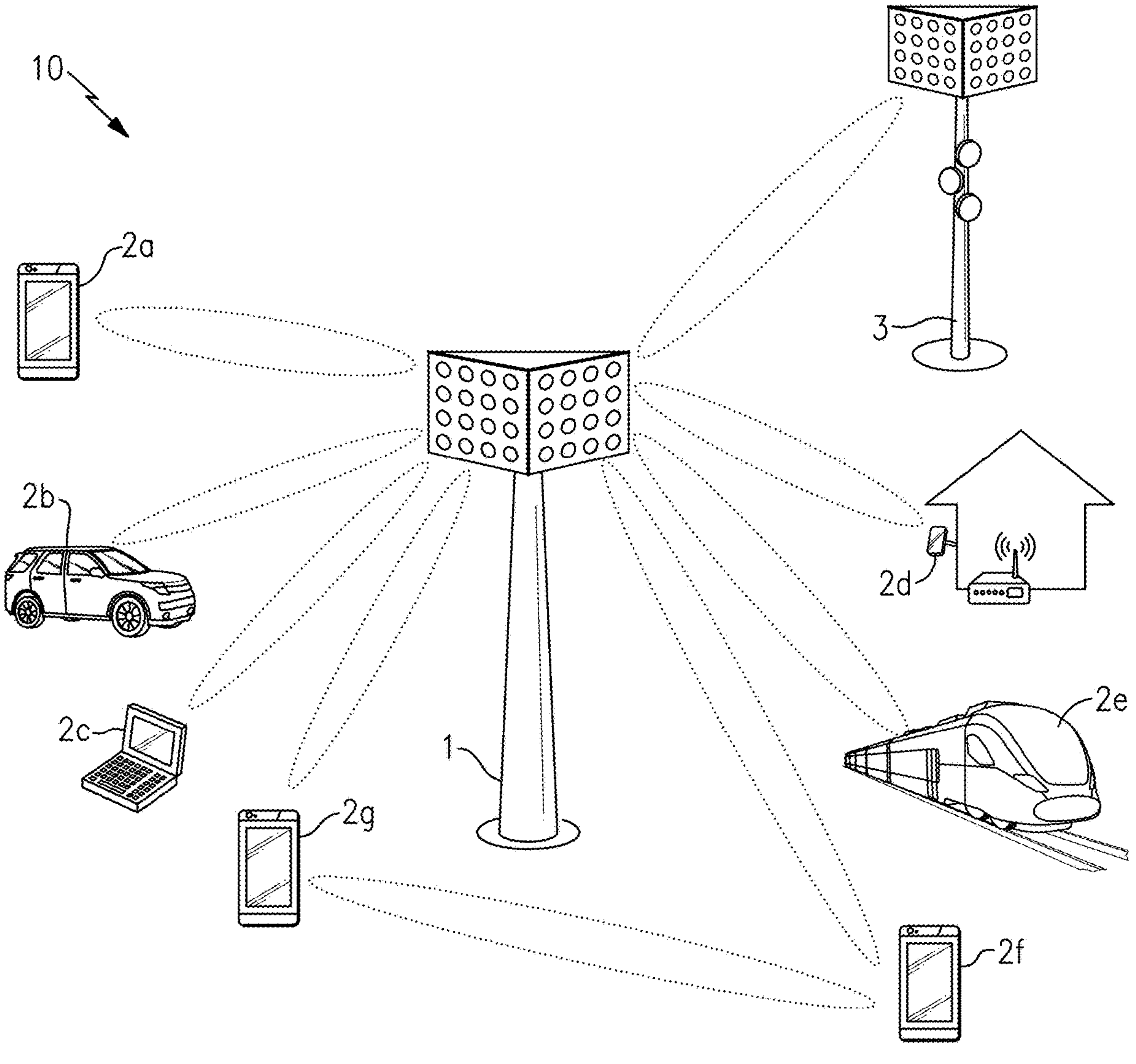
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a communication network 10. The communication network 10 includes a macro cell base station 1, a small cell base station 3, and various examples of user equipment (UE), including a first mobile device 2*a*, a wireless-connected car 2*b*, a laptop 2*c*, a stationary wireless device 2*d*, a wireless-connected train 2*e*, a second mobile device 2*f*, and a third mobile device 2*g*.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2*g* and mobile device 2*f*).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands which include 5G FR2. Thus, as used herein a millimeter wave signal can include traditional millimeter waves (30 GHz to 300 GHz) as well as upper centimeter wave frequencies in the range of 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
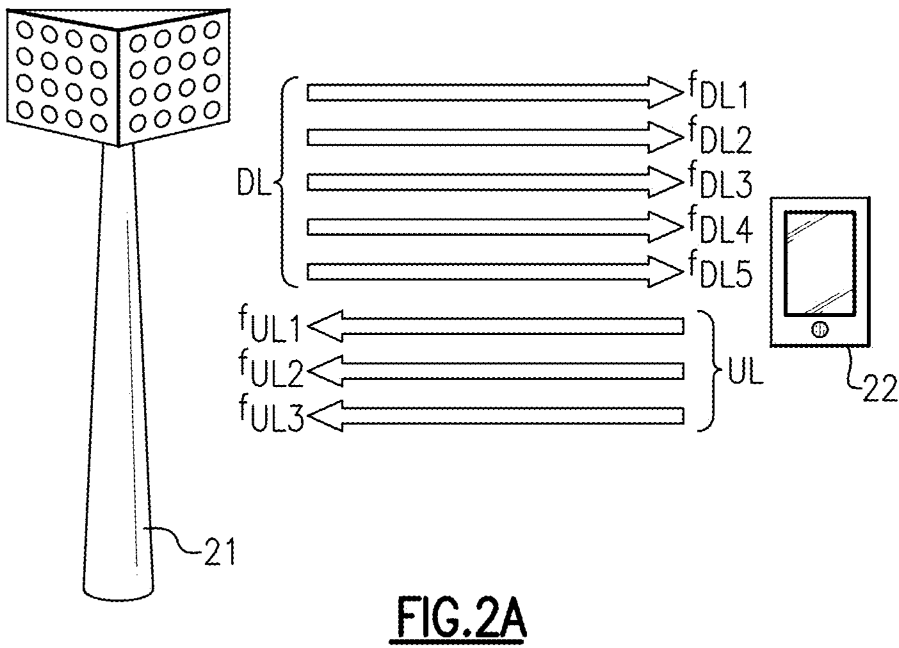
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
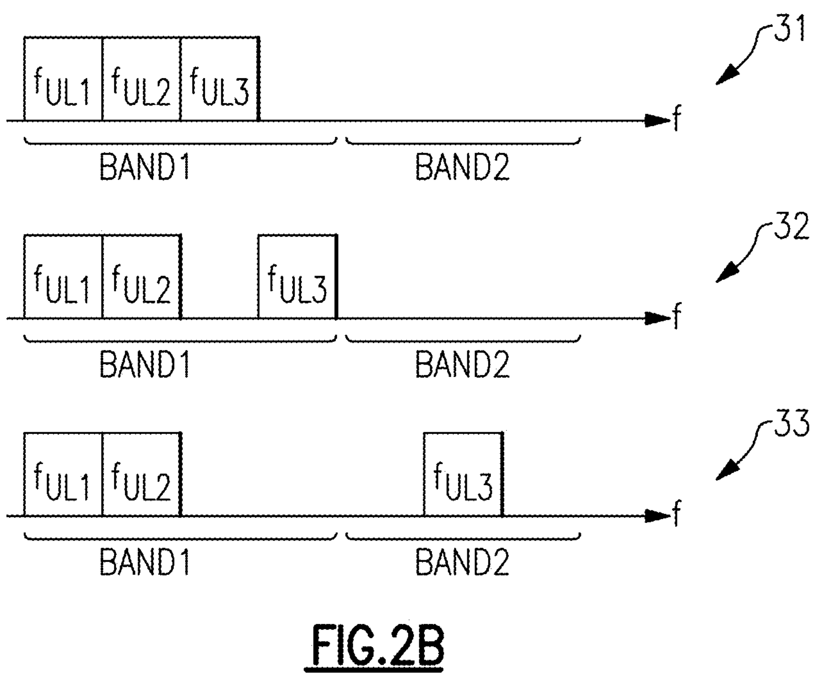
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers full and $f_{UL2}$ of a first frequency band BAND1 with component carrier $f_{UL3}$ of a second frequency band BAND2.

Figure 2C:
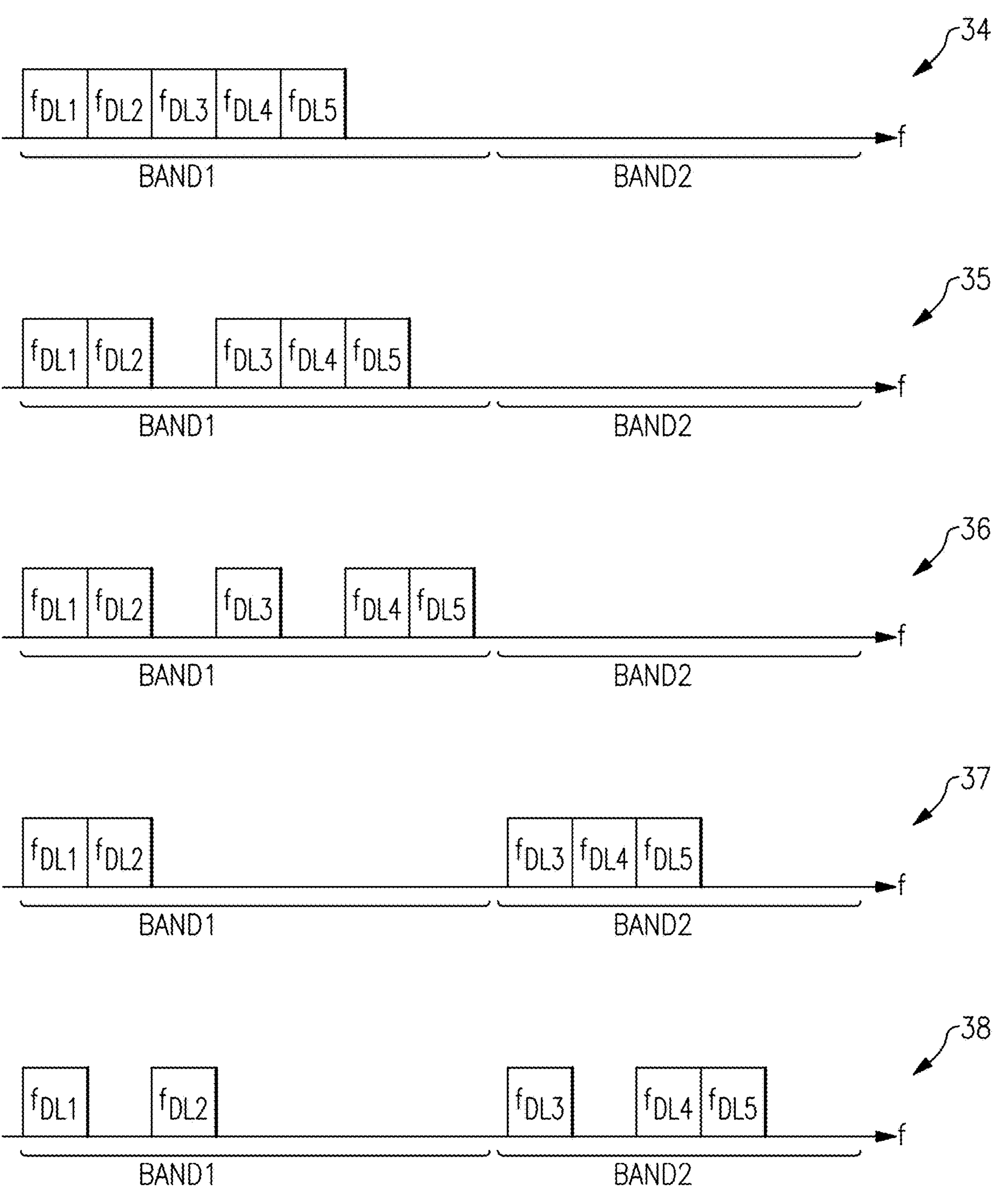
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
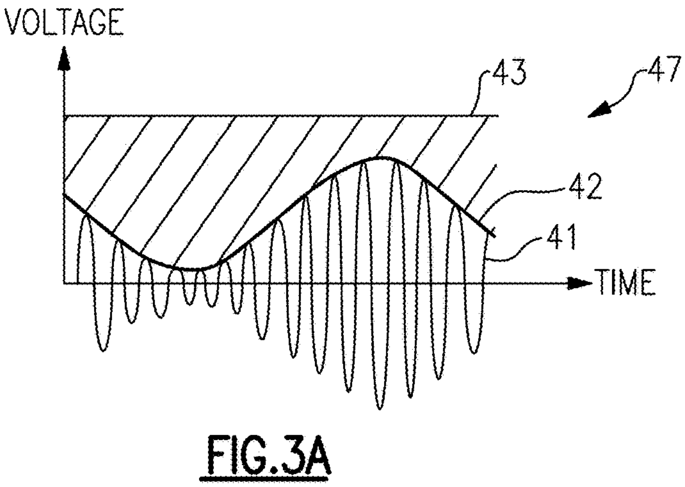
FIG. 3A is a graph showing a first example of power amplifier supply voltage versus time.

FIG. 3A is a graph 47 showing a first example of power amplifier supply voltage versus time. The graph 47 illustrates the voltage of an RF signal 41, the RF signal's envelope 42, and a power amplifier supply voltage 43 versus time. The graph 47 corresponds to one example of waveforms for an implementation in which the power amplifier supply voltage 43 is substantially fixed.

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or other problems. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

Figure 3B:
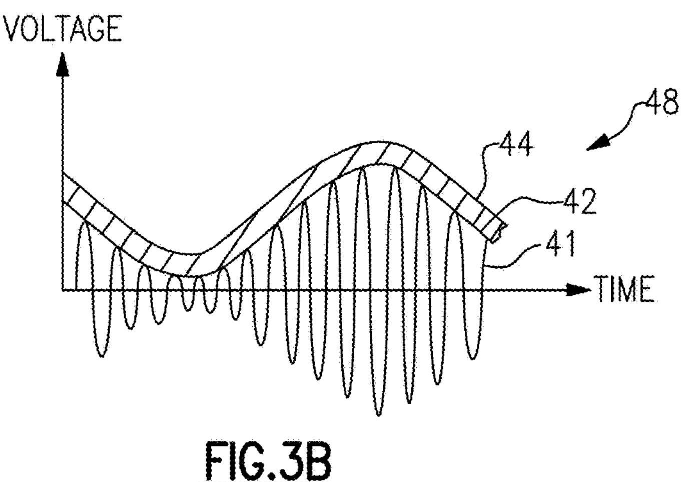
FIG. 3B is a graph showing a second example of power amplifier supply voltage versus time.

FIG. 3B is a graph 48 showing a second example of power amplifier supply voltage versus time. The graph 48 illustrates the voltage of an RF signal 41, the RF signal's envelope 42, and a power amplifier supply voltage 44 versus time. The graph 48 corresponds to one example of waveforms for an implementation in which the power amplifier supply voltage 44 is generated by envelope tracking.

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 43 of FIG. 3A, the power amplifier supply voltage 44 of FIG. 3B changes in relation to the envelope 42 of the RF signal 41. The area between the power amplifier supply voltage 44 and the envelope 42 in FIG. 3B is less than the area between the power amplifier supply voltage 43 and the envelope 42 in FIG. 3A, and thus the graph 48 of FIG. 3B can be associated with a power amplifier system having greater energy efficiency.

Figure 3C:
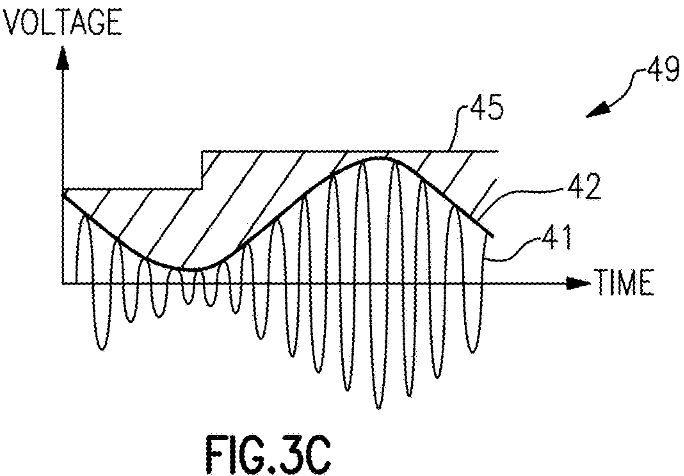
FIG. 3C is a graph showing a third example of power amplifier supply voltage versus time.

FIG. 3C is a graph 49 showing a third example of power amplifier supply voltage versus time. The graph 49 illustrates the voltage of an RF signal 41, the RF signal's envelope 42, and a power amplifier supply voltage 45 versus time. The graph 49 corresponds to one example of waveforms for an implementation in which the power amplifier supply voltage 45 is generated by average power tracking (APT).

APT is one technique for improving efficiency of a power amplifier, in which the voltage level of a power amplifier's supply voltage is controlled based on a power amplifier's average output power. When operating using APT, the voltage level of the power amplifier supply voltage can be substantially fixed for a particular time slot, but adjusted for a subsequent time slot based on average output power (for instance, transmission power control level). APT can achieve gain in efficiency relative to a fixed power amplifier supply voltage, but less efficiency gain compared to envelope tracking. However, envelope tracking can have a higher complexity, cost, and/or overhead relative to APT.

Figure 4:
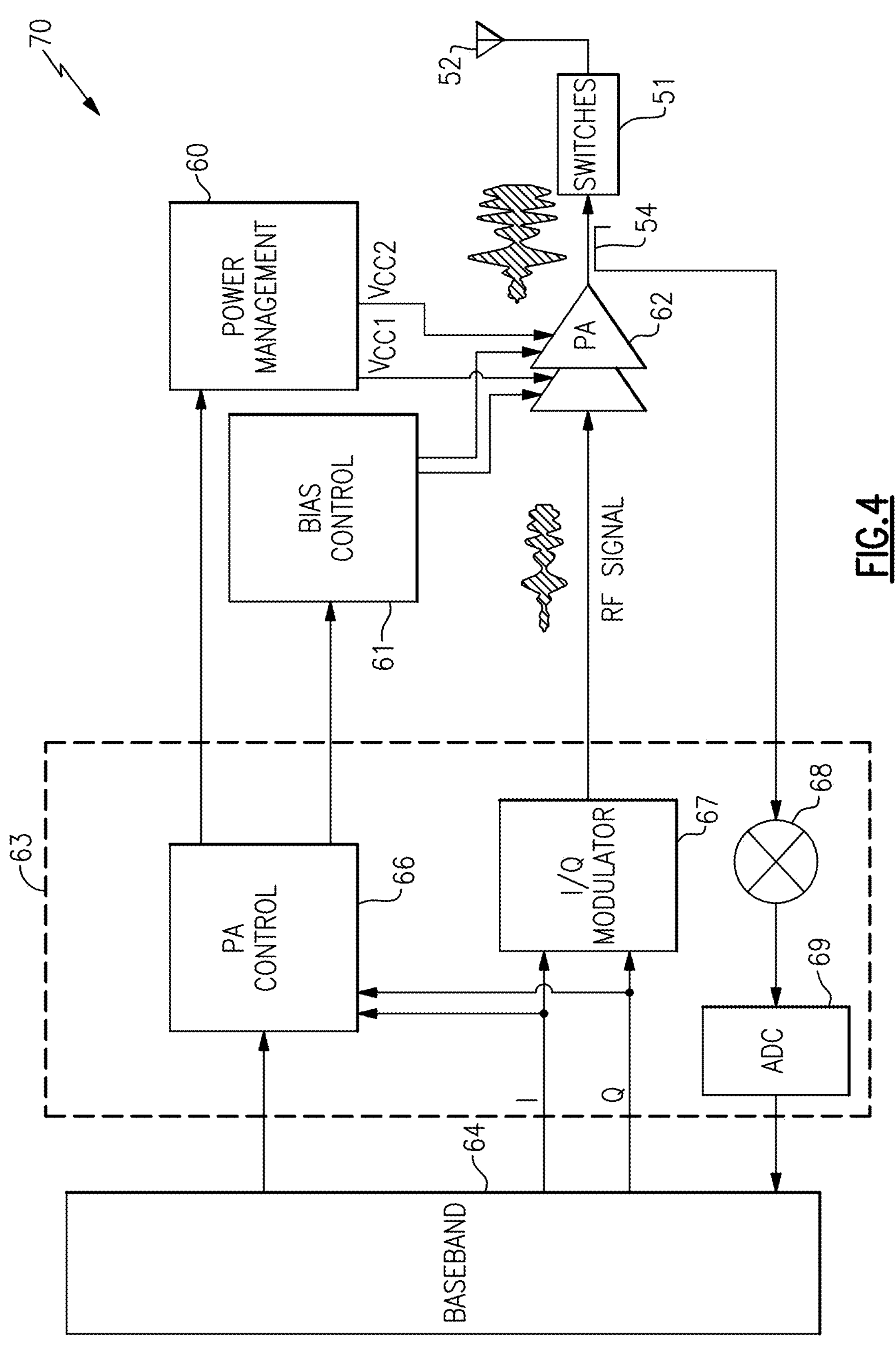
FIG. 4 is a schematic diagram of one embodiment of a power amplifier system.

FIG. 4 is a schematic diagram of one embodiment of a power amplifier system 70. The illustrated power amplifier system 70 includes switches 51, an antenna 52, a directional coupler 54, a power management circuit 60, a bias control circuit 61, a power amplifier 62, a transceiver 63, and a baseband processor 64.

Although FIG. 4 illustrates one embodiment of a power amplifier system, the teachings herein are applicable to power amplifier systems implemented in a wide variety of ways. For example, a power amplifier system can include more or fewer components, a different arrangement of components, and/or components implemented in different ways.

In the illustrated embodiment, the transceiver 63 includes a power amplifier control circuit 66, an I/Q modulator 67, a mixer 68, and an analog-to-digital converter (ADC) 69. Although not illustrated in FIG. 4 for clarity, the transceiver 63 can also process signals received from one or more antennas (for example, the antenna 52 and/or other antenna(s)) by way of one or more receive paths. Furthermore, the transceiver 63 can be implemented in other ways, including, but not limited to, using different implementations of transmit path(s), observation path(s), and/or power amplifier control circuitry.

The baseband signal processor 64 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 67 in a digital format. The baseband processor 64 can be any suitable processor configured to process a baseband signal. For instance, the baseband processor 64 can include a digital signal processor, a microprocessor, a programmable core, or any combination thereof. Moreover, in some implementations, two or more baseband processors 64 can be included in the power amplifier system 70.

The I/Q modulator 67 can be configured to receive the I and Q signals from the baseband processor 64 and to process the I and Q signals to generate an RF signal. For example, the I/Q modulator 67 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 62. In certain implementations, the I/Q modulator 67 can include one or more filters configured to filter frequency content of signals processed therein.

The power amplifier 62 can receive the RF signal from the I/Q modulator 67, and when enabled can provide an amplified RF signal to the antenna 52 via the switches 51. The directional coupler 54 can be positioned between the output of the power amplifier 62 and the input of the switches 51, thereby allowing an output power measurement of the power amplifier 62 that does not include insertion loss of the switches 51. However, other configurations of power measurement are possible.

The switches 51 includes an antenna switch and/or band switch, in this embodiment. The switches 51 can be implemented with SOI processing in accordance with the teachings herein.

In the illustrated configuration, the sensed output signal from the directional coupler 54 is provided to the mixer 68, which multiplies the sensed output signal by a reference signal of a controlled frequency. The mixer 68 operates to generate a downshifted signal by downshifting the sensed output signal's frequency content. The downshifted signal can be provided to the ADC 69, which can convert the downshifted signal to a digital format suitable for processing by the baseband processor 64. By including a feedback path between the output of the power amplifier 62 and the baseband processor 64, the baseband processor 64 can be configured to dynamically adjust the I and Q signals to optimize the operation of the power amplifier system 70. For example, configuring the power amplifier system 70 in this manner can aid in controlling the PAE and/or linearity of the power amplifier 62.

In the illustrated embodiment, the power management circuit 60 receives a power control signal from the transceiver 63, and controls the supply voltages of the power amplifier 62. In certain implementations, the transceiver 63 is electrically connected to the power management circuit 60 via a serial interface, and the power management circuit 60 receives the power control signal over the serial interface.

As shown in FIG. 4, the power management circuit 60 generates a first supply voltage $V_{CC1}$ for powering an input stage of the power amplifier 62 and a second supply voltage $V_{CC2}$ for powering an output stage of the power amplifier 62. The power management circuit 60 can control the voltage level of the first supply voltage $V_{CC1}$ and/or the second supply voltage $V_{CC2}$ to enhance the power amplifier system's PAE. Although an embodiment with two controllable supply voltages is shown, a power management circuit can control the voltage levels of more or fewer supply voltages. In certain implementations, a power amplifier operates with one or more controllable supply voltages and one or more substantially fixed supply voltages.

In the illustrated embodiment, the power control signal instructs the power management circuit 60 to operate in a particular supply control mode, such as an APT mode or an ET mode. Thus, the power amplifier control circuit 66 of the transceiver 63 controls the selected supply control mode, in this embodiment.

As shown in FIG. 4, the bias control circuit 61 receives a bias control signal from the transceiver 63, and generates bias control signals for the power amplifier 62. Additionally, the bias control circuit 61 generates the bias control signals based on the bias control signal.

The bias control signal identifies the supply control mode that the power management circuit 60 is operating in, and the bias control circuit 61 generates the bias control signals based on the indicated supply control mode. In certain implementations, the transceiver 63 is electrically connected to the bias control circuit 61 via a serial interface, and the bias control circuit 61 receives a control word that indicates the selected supply control mode over the serial interface.

Silicon-on-Insulator Transistor on Broken Silicon Substrate for Higher Isolation One type of manufacturing technology for RF applications is silicon-on-insulator (SOI) processing. SOI technology uses a silicon-insulator-silicon structure to improve performance. For example, as compared to bulk silicon processes, SOI technology can offer lower parasitic capacitance, operation at lower voltage, higher isolation between transistors, better yield, reduced temperature dependency, and/or lower leakage currents.

At high frequencies (for instance, in the FR2 frequency range of 5G, corresponding to about 24.250 GHz to about 71.000 GHz), the impedance introduced by the silicon substrate used in SOI technology no longer provides ideal isolation, and thus impacts linearity, noise, and/or loss of radio frequency integrated circuits (RFICs).

To improve substrate isolation for SOI RFICs, various techniques have been used. In a first example, a high resistivity SOI (HRSOI) substrate is used to increase substrate resistance and provide a corresponding enhancement in transistor isolation. In a second example, trapped charges are introduced at the buried oxide (BOX)/substrate interface, thereby providing a trap rich SOI (TRSOI) substrate for even higher resistivity and a corresponding decrease in coupling effects. In yet another example, SOI blanket trenches (BTQ) are provided within a HRSOI substrate near the BOX/substrate interface. Although these processing techniques reduce substrate coupling and/or lower loss, such techniques also add cost and/or additional processing steps.

In certain applications, one or more SOI transistors are placed in series to serve as an RF switch. For example, RF switches built in RFSOI technologies have found wide application due to low cost for volume production, easy integration with other RF modules, and/or high on-state resistance/off-state capacitance (Ron*Coff) product. The linearity of an RFSOI switch, however, is still short of performance compared to switches built using compound semiconductor III-V technologies. Although the substrate engineering techniques discussed above improve switch linearity to a certain degree, such techniques are insufficient for high frequency cellular applications, for instance, for RF front-end components for 5G FR2.

In certain embodiments herein, a silicon substrate for an SOI process is separated into sub-regions or islands by dielectric. Thus, the substrate is changed from having one region and one shared contact into multiple substrate sub-regions with independent contacts. Since the substrate serves as a back gate to SOI transistors formed in an active silicon layer, breaking the substrate into independent or separate islands leads to a drop in the impact of each island on the drain-to-source voltage and/or gate-to-source voltage (Vds/Vgs) of the SOI transistors. Accordingly, reduced harmonics and improved linearity are achieved.

The silicon substrate can be broken into separate islands in a wide variety of ways, including through deep trench (DT) from the top of the wafer, focused ion beam (FIB) etching from the back of the wafer, and/or other processing techniques.

Figures 5, 6A, 6B, 6C, 6D:
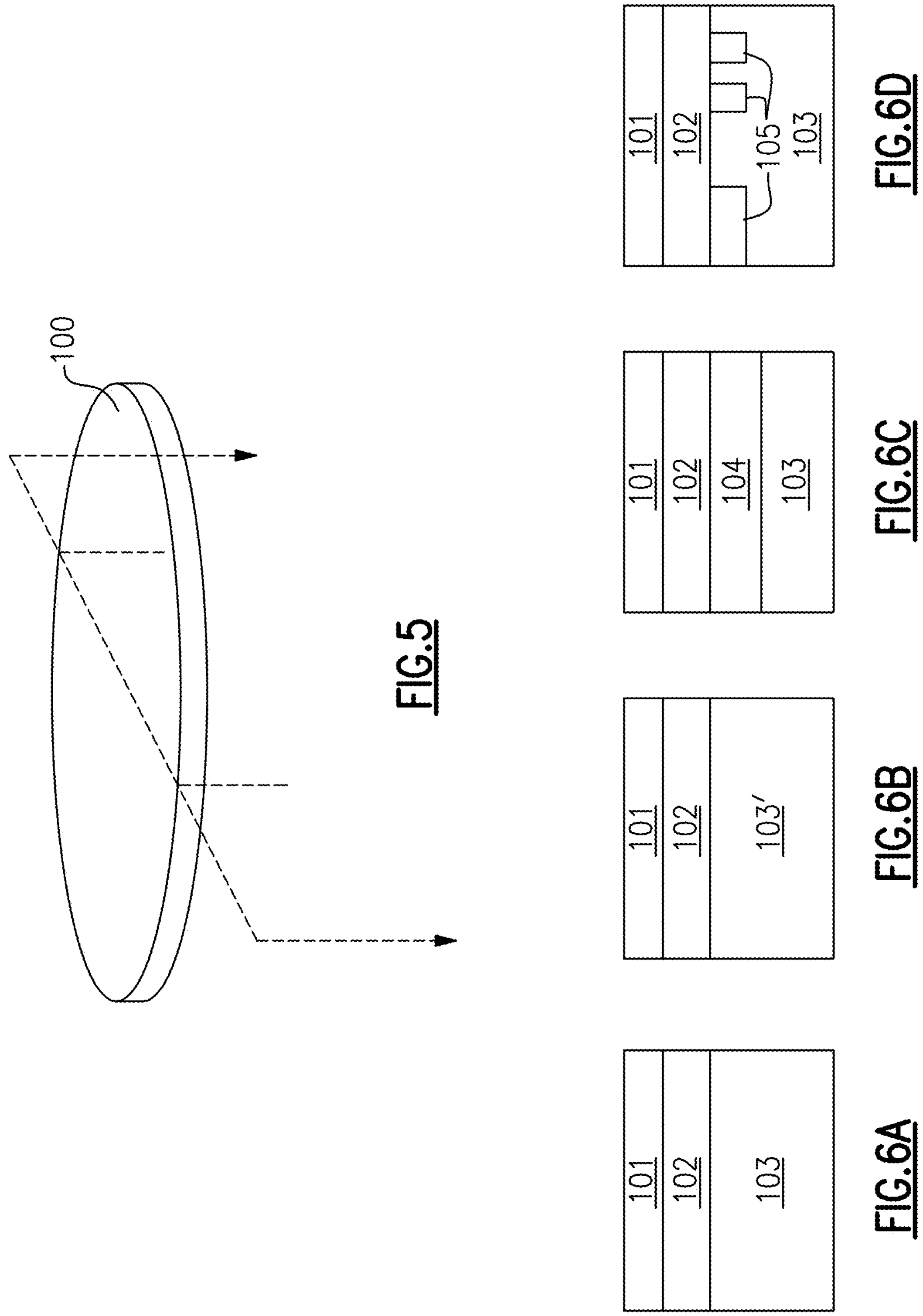
FIG. 5 is a perspective view of one example of a silicon on insulator (SOI) wafer.
FIG. 6A is a first example of a cross-section of the SOI wafer of FIG. 5.
FIG. 6B is a second example of a cross-section of the SOI wafer of FIG. 5.
FIG. 6C is a third example of a cross-section of the SOI wafer of FIG. 5.
FIG. 6D is a fourth example of a cross-section of the SOI wafer of FIG. 5.

FIG. 5 is a perspective view of one example of a silicon on insulator (SOI) wafer 100.

FIG. 6A is a first example of a cross-section of the SOI wafer 100 of FIG. 5. In this example, the SOI wafer 100 includes an active silicon region or layer 101, a buried oxide (BOX) layer 102, and a silicon substrate 103. SOI transistors and other circuitry are formed in the active silicon layer 101. However, the silicon substrate 103 serves as a back gate that can impact the performance of the SOI transistors.

FIG. 6B is a second example of a cross-section of the SOI wafer 100 of FIG. 5. In this example, the SOI wafer 100 includes an active silicon layer 101, a BOX layer 102, and a high resistivity silicon substrate 103'. Thus, in comparison to the cross-section of FIG. 6A, the cross-section of FIG. 6B includes the high resistivity silicon substrate 103' for isolation enhancement. The cross-section of FIG. 6B is referred to as HRSOI.

FIG. 6C is a third example of a cross-section of the SOI wafer 100 of FIG. 5. In this example, the SOI wafer 100 includes an active silicon layer 101, a BOX layer 102, a silicon substrate 103 (which can be regular or high resistivity), and a trap rich layer 104. Thus, in comparison to the cross-section of FIG. 6A, the cross-section of FIG. 6C includes the trap rich layer 104 added between the BOX layer 102 and the silicon substrate 103. The cross-section of FIG. 6C is referred to as TRSOI.

FIG. 6D is a fourth example of a cross-section of the SOI wafer 100 of FIG. 5. In this example, the SOI wafer 100 includes an active silicon layer 101, a BOX layer 102, a silicon substrate 103 (which can be regular or high resistivity), and BTQ trenches or area 105. Thus, in comparison to the cross-section of FIG. 6A, the cross-section of FIG. 6D includes BTQ area 105, which can correspond to additional isolations added at selected regions of the interface between the BOX layer 102 and the substrate 103. The cross-section of FIG. 6D is referred to as BTQ with HRSOI.

With reference to FIGS. 5 to 6D, in a typical wafer, due to fixed oxide charge, the BOX ($SiO_2$)/substrate interface is typically in a strong inversion region, which leads to presence of a low resistivity conduction layer (also referred to as a parasitic surface conduction layer or PSC layer).

Various processing techniques discussed above can enhance isolation and reduce the impacts of the PSC layer. For example, TRSOI processing can improve linearity, reduce cross-talk, and/or lower loss of SOI transistors arising from presence of the SOI substrate. However, with TRSOI the Fermi level is pinned or fixed. Thus, the wafer substrate is still connected as a whole and capacitive coupling is still present.

In accordance with the teachings herein, the silicon substrate is separated or broken by dielectric from one substrate into multiple substrate regions or islands. Such processing can be done using FIB (from the bottom of the wafer opposite the top or active side), deep trench (from the bottom of the wafer), or other techniques. Accordingly, isolation areas (for example, holes and/lines) are formed (for example, drilled or etched) at the silicon substrate/BOX interface and filled with dielectric (for example, $SiO_2$) to provide isolation. The processing can be done before or after formation of active transistors.

By implementing the silicon substrate of an SOI wafer in this manner, the PSC layer is reduced or removed for enhanced performance. Moreover, such enhancement can be achieved with low cost wafers while providing better isolation than trap rich wafers and/or wafers with complicated processing.

Figures 7A, 7B, 7C, 7D:
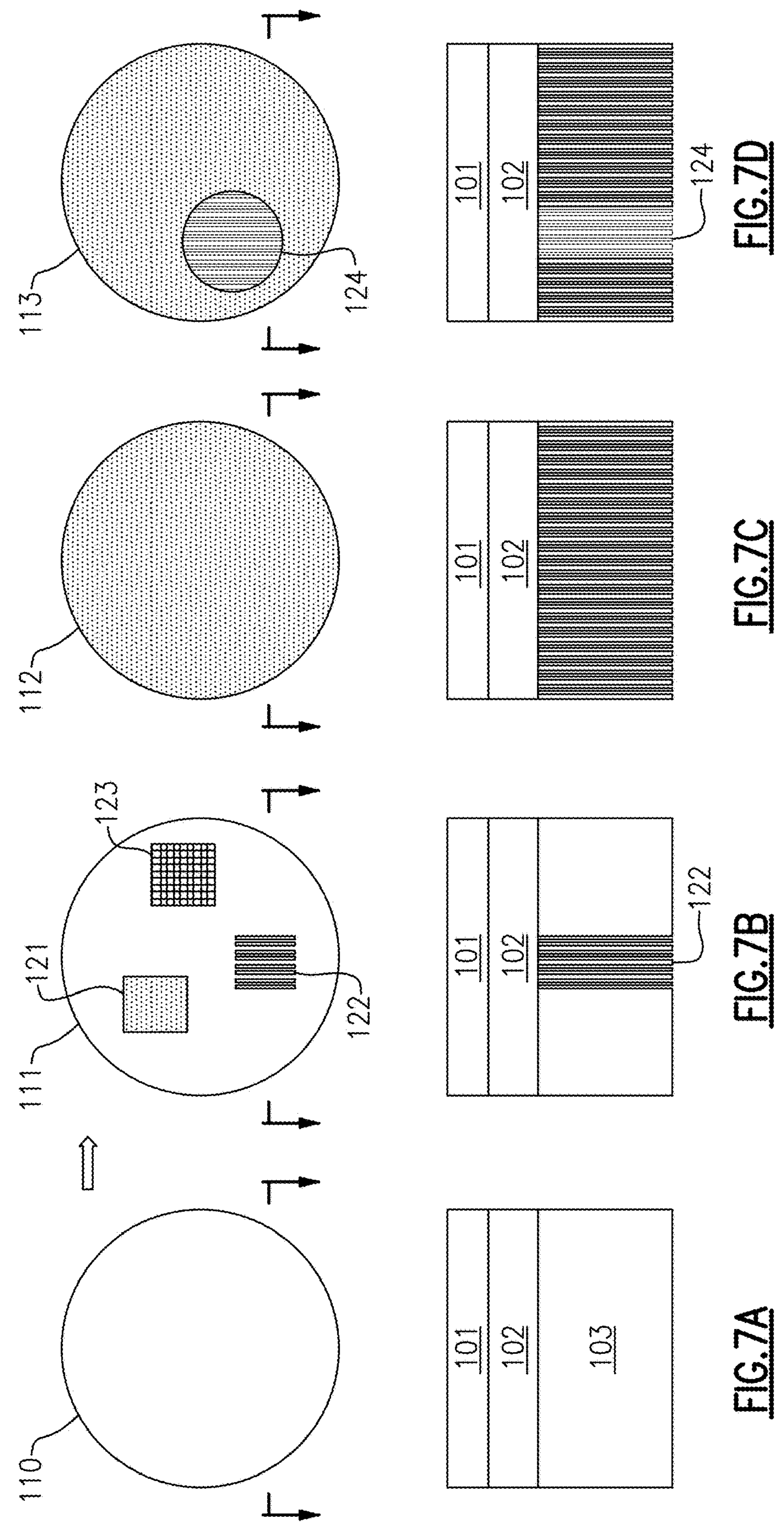
FIG. 7A is a cross-section and an overhead view of an SOI wafer without silicon substrate processing.
FIG. 7B is a cross-section and an overhead view of an SOI wafer with silicon substrate processing according to one embodiment.
FIG. 7C is a cross-section and an overhead view of an SOI wafer with silicon substrate processing according to another embodiment.
FIG. 7D is a cross-section and an overhead view of an SOI wafer with silicon substrate processing according to another embodiment.

FIG. 7A is a cross-section and an overhead view of a SOI wafer 110 without silicon substrate processing. The SOI wafer 110 includes an active silicon layer 101, a BOX layer 102, and a silicon substrate 103.

FIG. 7B is a cross-section and an overhead view of an SOI wafer 111 with silicon substrate processing according to one embodiment. The SOI wafer 111 includes an active silicon layer 101, a BOX layer 102, and a silicon substrate that has been processed with FIB regions filled with $SiO_2$. In this example, three FIB regions (121, 122, and 123) with different patterns have been formed over different portions of the wafer.

FIG. 7C is a cross-section and an overhead view of an SOI wafer 112 with silicon substrate processing according to another embodiment. The SOI wafer 112 includes an active silicon layer 101, a BOX layer 102, and a silicon substrate that has been processed with FIB regions filled with $SiO_2$. In this example, the wafer is uniformly processed with FIB regions of the same pattern.

FIG. 7D is a cross-section and an overhead view of an SOI wafer 113 with silicon substrate processing according to another embodiment. The SOI wafer 113 includes an active silicon layer 101, a BOX layer 102, and a silicon substrate that has been processed with FIB regions filled with $SiO_2$. In this example, the wafer is uniformly processed with FIB regions of the same pattern except for a section 124 that is processed with a different pattern.

Figure 7G:
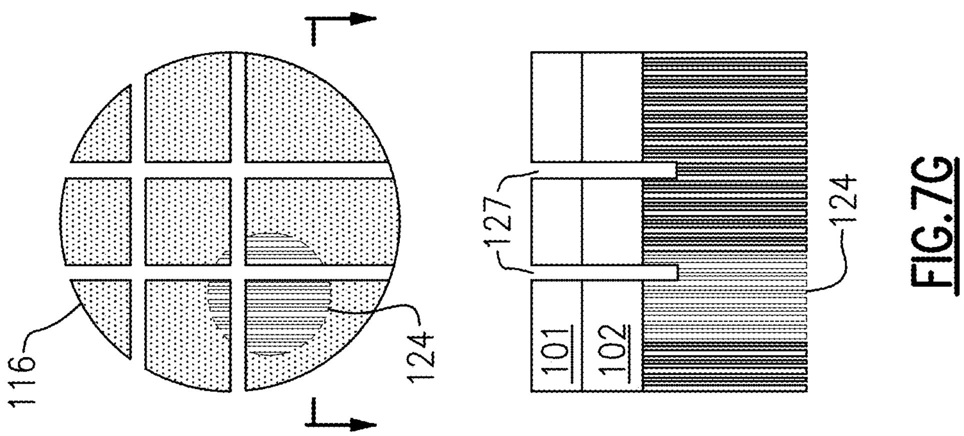
FIG. 7G is a cross-section and an overhead view of an SOI wafer with silicon substrate processing according to another embodiment.
Figure 7F:
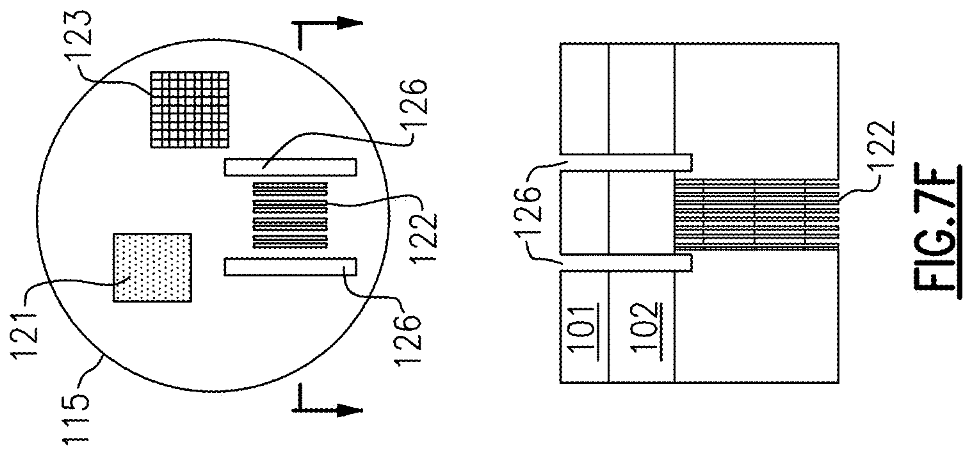
FIG. 7F is a cross-section and an overhead view of an SOI wafer with silicon substrate processing according to another embodiment.
Figure 7E:
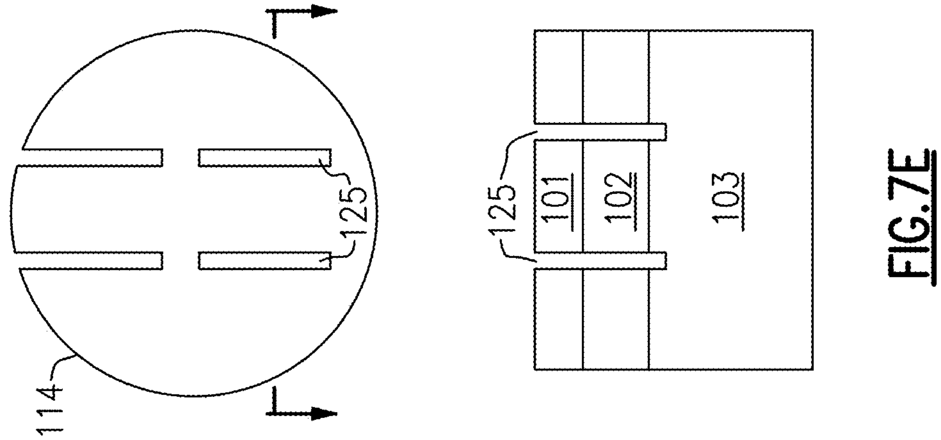
FIG. 7E is a cross-section and an overhead view of an SOI wafer with deep trench based substrate isolation.

FIG. 7E is a cross-section and an overhead view of an SOI wafer 114 with deep trench based substrate isolation. The SOI wafer 114 of FIG. 7E is similar to the SOI wafer 110 of FIG. 7A, except that the SOI wafer 114 of FIG. 7E further includes deep trenches 125. As shown in FIG. 7A, the deep trenches are formed through the active silicon layer 101 and the BOX layer 102 as well as a portion of the silicon substrate 103. However, the silicon substrate 103 is still continuous and is not partitioned or broken into separate pieces.

FIG. 7F is a cross-section and an overhead view of an SOI wafer 115 with silicon substrate processing according to another embodiment. The SOI wafer 115 includes an active silicon layer 101, a BOX layer 102, and a silicon substrate that has been processed with FIB regions filled with $SiO_2$. In this example, three FIB regions (121, 122, and 123) with different patterns have been formed over different portions of the wafer. Furthermore, deep trenches 126 have been formed in the SOI wafer 115.

The SOI wafer 115 of FIG. 7F is similar to the SOI wafer 111 of FIG. 7B, except that the SOI wafer 115 further includes the deep trenches 126.

FIG. 7G is a cross-section and an overhead view of an SOI wafer 116 with silicon substrate processing according to another embodiment. The SOI wafer 116 includes an active silicon layer 101, a BOX layer 102, and a silicon substrate that has been processed with FIB regions filled with $SiO_2$. In this example, the wafer is uniformly processed with FIB regions of the same pattern except for a section 124 that is processed with a different pattern. Furthermore, deep trenches 126 have been formed in the SOI wafer 116.

The SOI wafer 116 of FIG. 7G is similar to the SOI wafer 113 of FIG. 7D, except that the SOI wafer 116 further includes the deep trenches 126.

Figure 8:
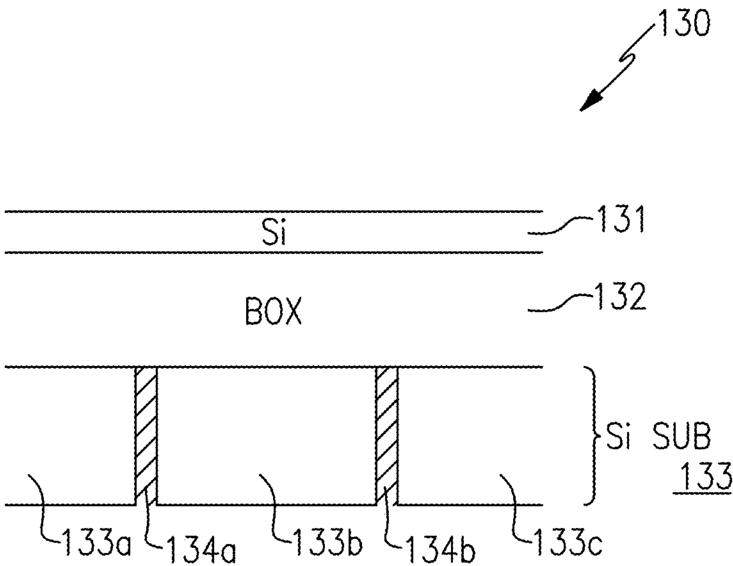
FIG. 8 is a cross-section of an SOI wafer according to another embodiment.

FIG. 8 is a cross-section of an SOI wafer 130 according to another embodiment. The SOI wafer 130 includes an active silicon layer 131 (including SOI transistors), a BOX layer 132, and a silicon substrate 133. The silicon substrate 133 includes dielectric regions 134*a*/134*b* that provide separation to form substrate island regions 133*a*/133*b*/133*c* which are isolated on all sides (laterally isolated) from one another by dielectric.

Figures 9A, 9B:
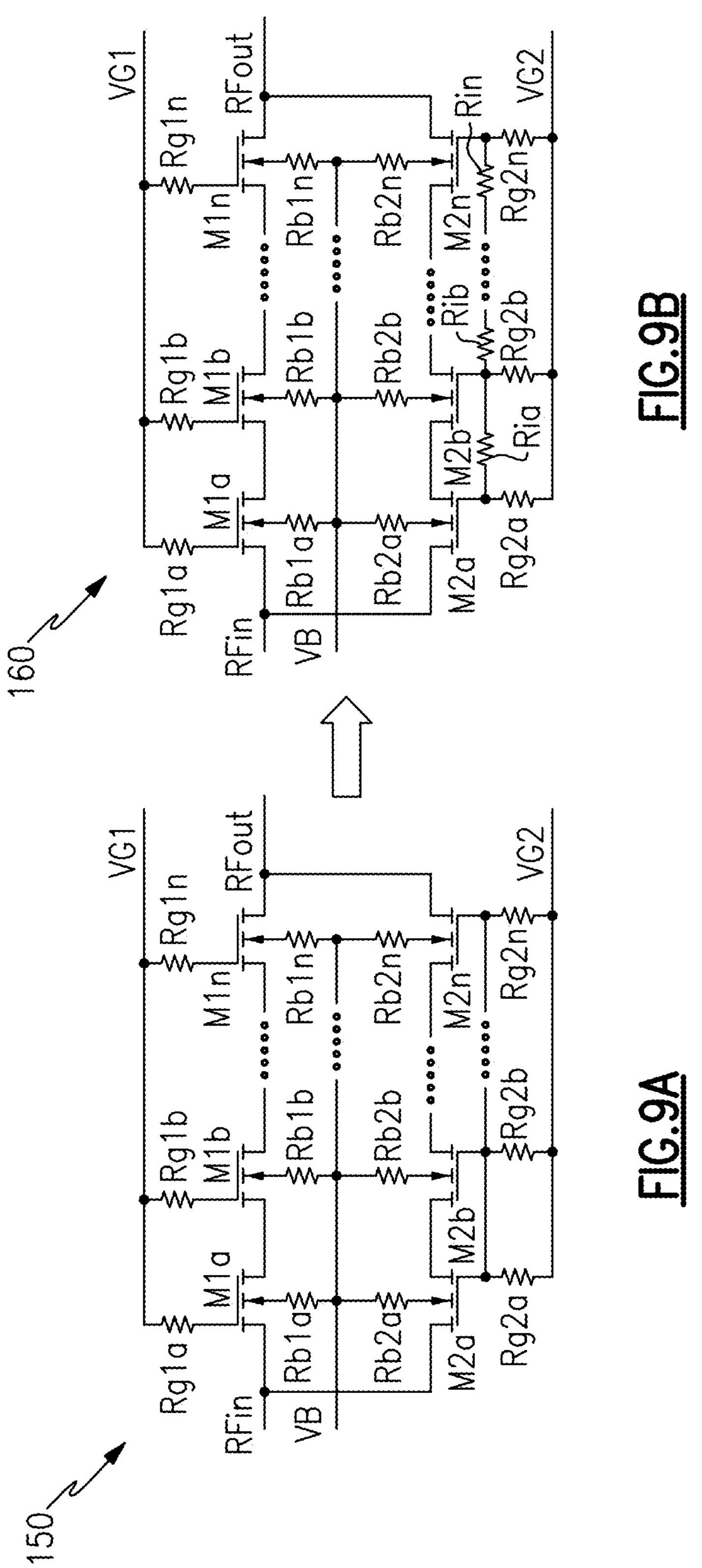
FIG. 9A is a schematic diagram of an SOI switch without silicon substrate processing.
FIG. 9B is a schematic diagram of an SOI switch with silicon substrate processing according to one embodiment.

FIG. 9A is a schematic diagram of an SOI switch 150 without silicon substrate processing. The SOI switch 150 includes series SOI transistors M1*a*, M1*b*, . . . , M1*n* which are connected in series between an RF input RFin and an RF output RFout. The SOI transistors M1*a*, M1*b*, . . . , M1*n* have gates biased by VG1 through corresponding gate resistors Rg1*a*, Rg1*b*, . . . , Rg1*n*, respectively. Additionally, the SOI transistors M1*a*, M1*b*, . . . M1*n* have bodies biased by VB through corresponding body resistors Rb1*a*, Rb1*b*, . . . , Rb1*n*, respectively. The number of components n can be any integer 1 or greater.

The presence of the silicon substrate leads to formation of a series of parasitic SOI transistors M2*a*, M2*b*, M2*n* which are connected in series between the RF input RFin and the RF output RFout. The parasitic SOI transistors M2*a*, M2*b*, M2*n* have gates biased by VG2 (corresponding to a substrate bias) through corresponding gate resistors Rg2*a*, Rg2*b*, Rg2*n*, respectively, but their gates are also shorted due to the continuous silicon substrate. Additionally, the parasitic SOI transistors M2*a*, M2*b*, M2*n* have bodies biased by VB through corresponding body resistors Rb2*a*, Rb2*b*, Rb2*n*, respectively.

For switches on the same substrate, the gate contact is the same, and therefore the Vds across the back gate is larger, which contributes to larger second harmonic, third harmonic, and/or intermodulation distortion products.

FIG. 9B is a schematic diagram of an SOI switch 160 with silicon substrate processing according to one embodiment. The SOI switch 160 includes similar components as the SOI switch 150 of FIG. 9A. However, in this embodiment, processing has been done to create separate islands in the silicon substrate, which results in the formation of isolation resistors Ria, Rib, . . . Rin that provide isolation (rather than shorting as in FIG. 9A) between the gates of the parasitic SOI transistors M2*a*, M2*b*, . . . M2*n*.

In comparison to FIG. 9A, after breaking the substrate into independent islands, the Vds/Vgs drop arising from each island is much reduced, which leads to lower harmonics from the substrate and improved performance.

Figures 10A, 10B:
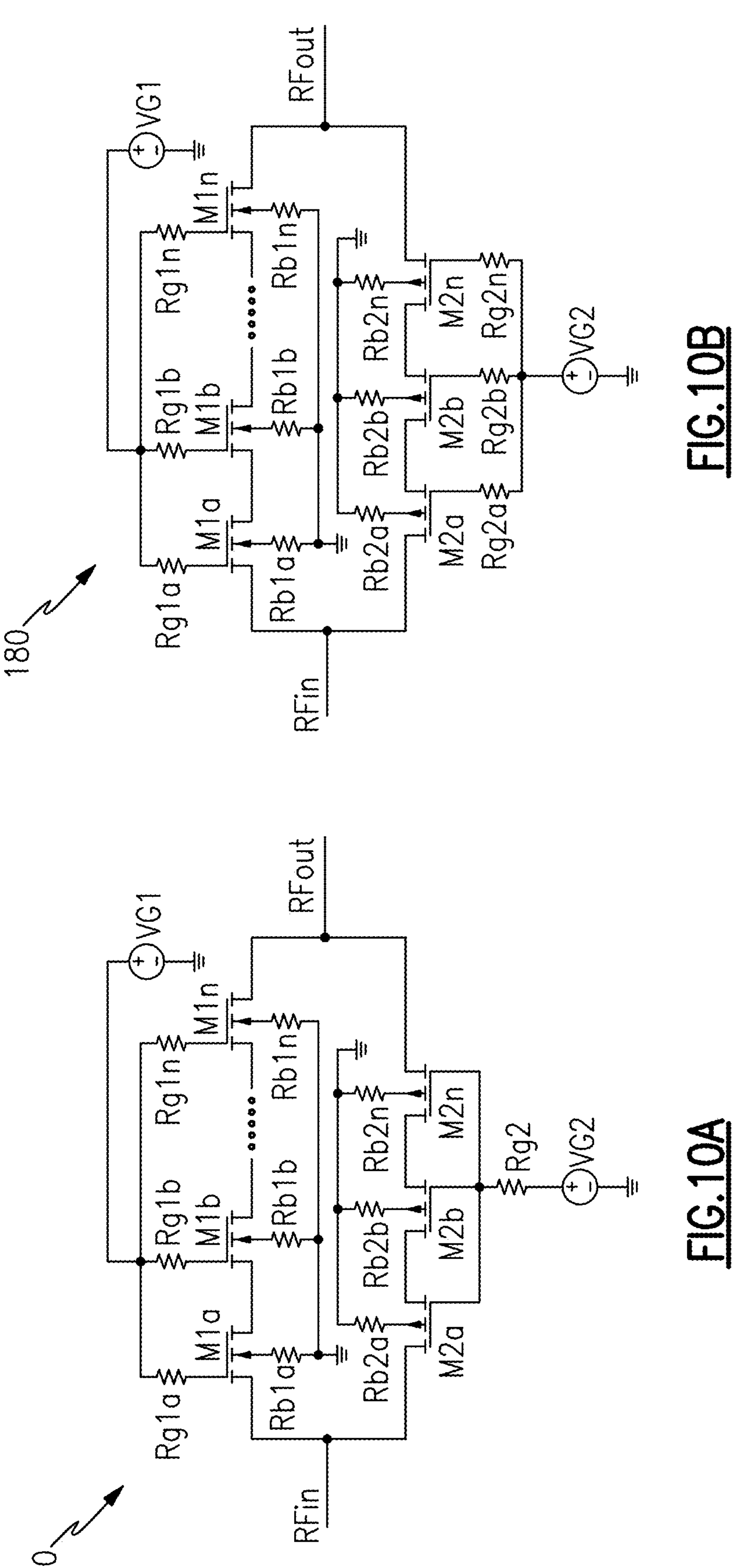
FIG. 10A is a schematic diagram of substrate biasing for an SOI switch without silicon substrate processing.
FIG. 10B is a schematic diagram of substrate biasing for an SOI switch with silicon substrate processing according to one embodiment.

FIG. 10A is a schematic diagram of substrate biasing for a SOI switch 170 without silicon substrate processing. The SOI switch 170 of FIG. 10A is similar to the SOI switch 150 of FIG. 9A, except that the gate resistors Rg2*a*, Rg2*b*, . . . Rg2*n* of FIG. 10A are represented by a gate resistor Rg. Additionally, VB is ground in this example, and explicit voltage sources for providing VG1 and VG2 are shown.

FIG. 10B is a schematic diagram of substrate biasing for an SOI switch 180 with silicon substrate processing according to one embodiment. The SOI switch 180 of FIG. 10B is similar to the SOI switch 170 of FIG. 10A, except separate gate resistors Rg2*a*, Rg2*b*, . . . Rg2*n* to each gate of the parasitic SOI transistors M2*a*, M2*b*, . . . M2*n* is shown.

Figure 11B:
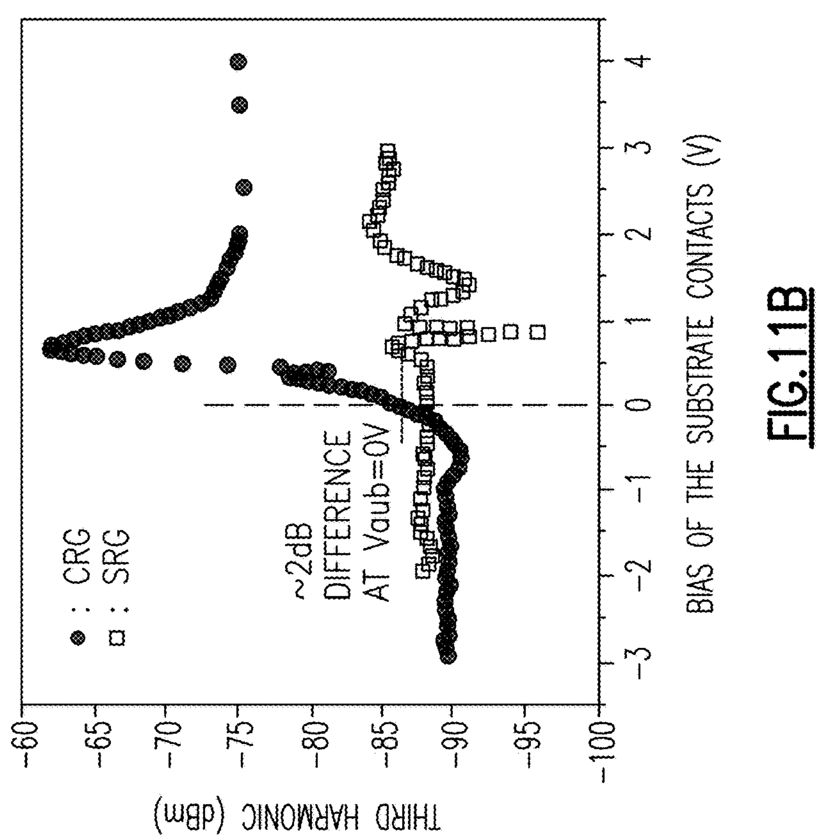
FIG. 11B is a graph of plots of third harmonic versus substrate bias.
Figure 11A:
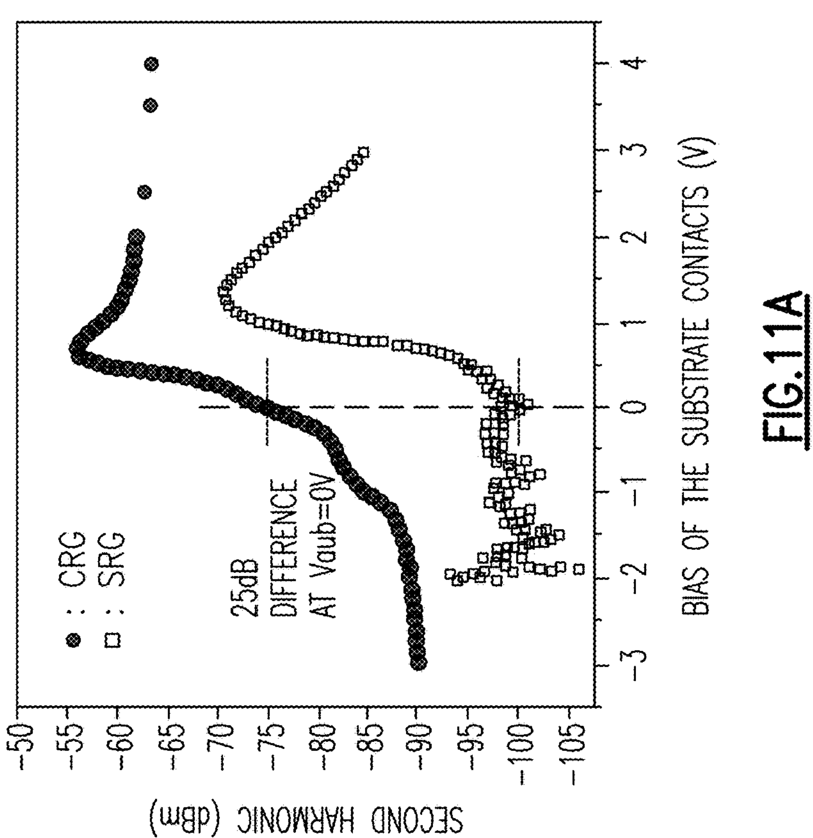
FIG. 11A is a graph of plots of second harmonic versus substrate bias.
Figure 12:
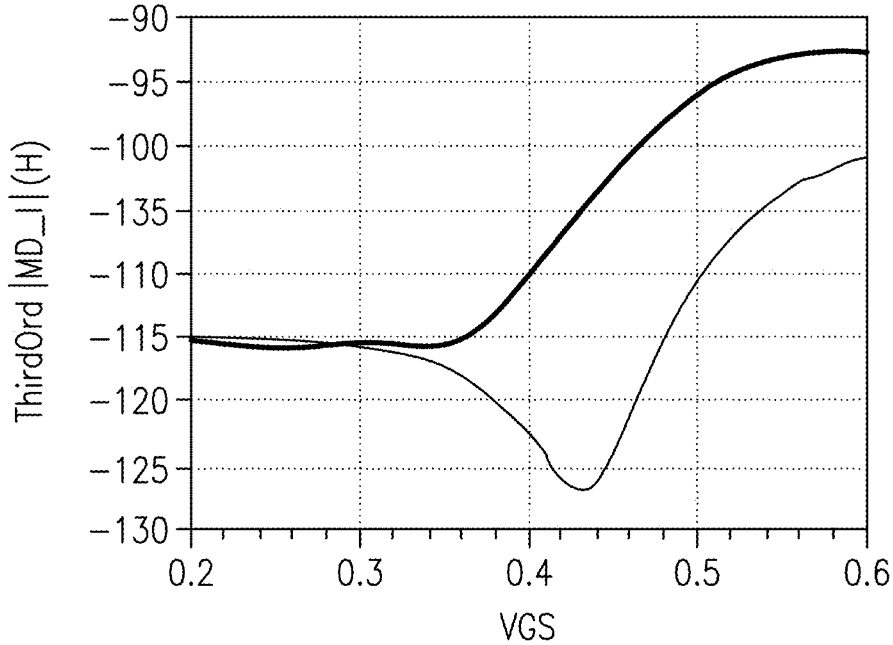
FIG. 12 is a graph of third order intermodulation distortion versus gate to source voltage.

FIGS. 11A, 11B, and 12 simulate various performance characteristics of SOI switch 170 of FIG. 10A relative to the SOI switch 180 of FIG. 10B. Although various simulation results are shown, other simulation results are possible, such as simulation results that depend on component values, circuit models, simulation parameters, and/or other factors.

FIG. 11A is a graph of plots of second harmonic versus substrate bias. As shown in FIG. 11A, the SOI switch 180 of FIG. 10B exhibits superior second harmonic performance (about 25 dBm) relative to the SOI switch 170 of FIG. 10A.

FIG. 11B is a graph of plots of third harmonic versus substrate bias. As shown in FIG. 11A, the SOI switch 180 of FIG. 10B exhibits superior third harmonic performance (about 2 dB) relative to the SOI switch 170 of FIG. 10A.

FIG. 12 is a graph of third order intermodulation distortion versus gate to source voltage. As shown in FIG. 12, the SOI switch 180 of FIG. 10B exhibits lower intermodulation distortion relative to the SOI switch 170 of FIG. 10A.

Figures 13A, 13B:
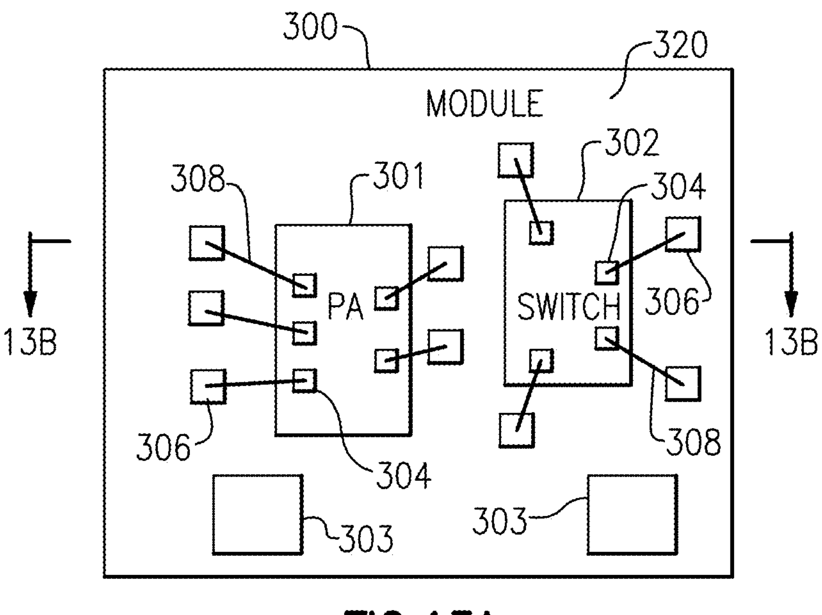
FIG. 13A is a schematic diagram of one embodiment of a packaged module.
FIG. 13B is a schematic diagram of a cross-section of the packaged module of FIG. 13A taken along the lines 13B-13B.

FIG. 13A is a schematic diagram of one embodiment of a packaged module 300. FIG. 13B is a schematic diagram of a cross-section of the packaged module 300 of FIG. 13A taken along the lines 13B-13B.

The packaged module 300 includes an amplifier die 301, a switch die 302, surface mount components 303, wirebonds 308, a package substrate 320, and encapsulation structure 340. The package substrate 320 includes pads 306 formed from conductors disposed therein. Additionally, the dies 301, 302 include pads 304, and the wirebonds 308 have been used to connect the pads 304 of the dies 301, 302 to the pads 306 of the package substrate 320.

The amplifier die 301 and/or the switch die 302 are implemented in accordance with one or more features of the present disclosure. In certain implementations, the amplifier die 301 and/or the switch die 302 include SOI transistors implemented with one or more substrate processing techniques in accordance with the teachings herein.

The packaging substrate 320 can be configured to receive a plurality of components such as the dies 301, 302 and the surface mount components 303, which can include, for example, surface mount capacitors and/or inductors.

As shown in FIG. 13B, the packaged module 300 is shown to include a plurality of contact pads 332 disposed on the side of the packaged module 300 opposite the side used to mount the dies 301, 302. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the dies 301, 302 and/or the surface mount components 303. As shown in FIG. 13B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 14:
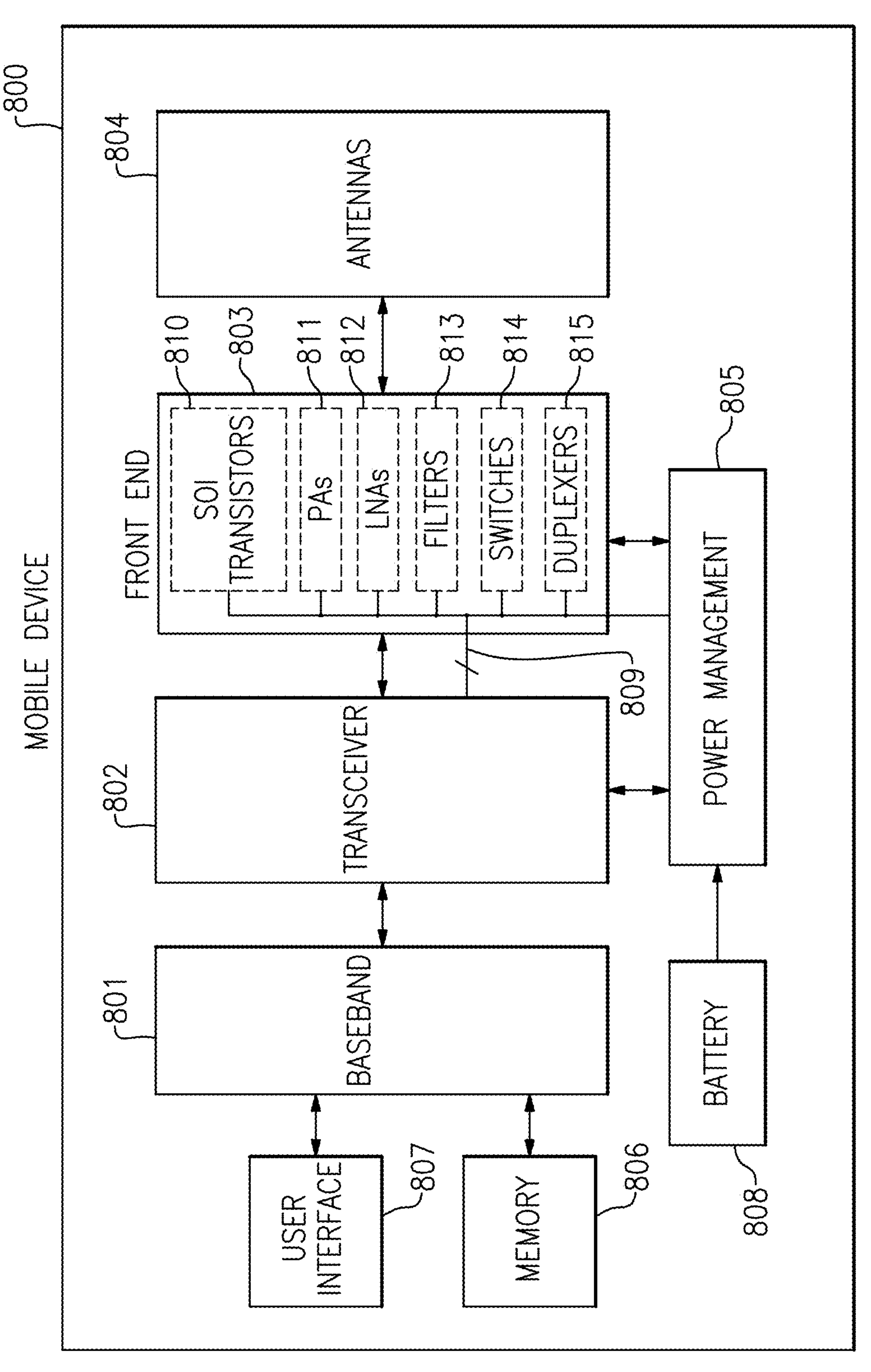
FIG. 14 is a schematic diagram of one embodiment of a mobile device.

FIG. 14 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

Although the mobile device 800 illustrates one example of an RF system that can include one or more features of the present disclosure, the teachings herein are applicable to electronic systems implemented in a wide variety of ways.

The mobile device 800 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 14 as the transceiver 802. In one example, separate components (for instance, separate circuits or dies) can be provided for handling certain types of RF signals.

As shown in in FIG. 14, the transceiver 802 is connected to the front end system 803 and to the power management circuit 805 using a serial interface 809. All or part of the illustrated RF components can be controlled by the serial interface 809 to configure the mobile device 800 during initialization and/or while fully operational. In another embodiment, the baseband processor 801 is additionally or alternatively connected to the serial interface 809 and operates to configure one or more RF components, such as components of the front end system 803 and/or power management system 805.

The front end system 803 aids in conditioning signals transmitted to and/or received from the antennas 804. In the illustrated embodiment, the front end system 803 includes one or more SOI transistors 810, which can be used to implement one or more power amplifiers (PAs) 811, one or more low noise amplifiers (LNAs) 812, one or more filters 813, one or more switches 814, and one or more duplexers 815. However, other implementations are possible. The SOI transistors 810 can be implemented in accordance with any of the embodiments herein.

The front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 14, the baseband system 801 is coupled to the memory 806 to facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a power amplifier (PA) supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

The power management system 805 can operate in a selectable supply control mode, such as an APT mode or an ET mode. In the illustrated embodiment, the selected supply control mode of the power management system 805 is controlled by the transceiver 802. In certain implementations, the transceiver 802 controls the selected supply control mode using the serial interface 809.

As shown in FIG. 14, the power management system 805 receives a battery voltage from the battery 808. The battery 808 can be any suitable battery for use in the mobile device 800, including, for example, a lithium-ion battery. Although the power management system 805 is illustrated as separate from the front end system 803, in certain implementations all or part (for instance, a PA supply control circuit) of the power management system 805 is integrated into the front end system 803.

Applications

Some of the embodiments described above have provided examples in connection with wireless devices or mobile phones. However, the principles and advantages of the embodiments can be used for any other systems or apparatus that have needs for SOI transistors.

Such SOI transistors can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above detailed description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A silicon-on-insulator wafer comprising:

a silicon substrate broken into two or more substrate regions by a dielectric, the two or more substrate regions including a plurality of islands that are laterally isolated from one another on all sides by the dielectric;

a buried oxide layer formed over the silicon substrate; and an active silicon layer formed over the buried oxide layer and including a plurality of silicon-on-insulator transistors, the plurality of islands forming a plurality of isolation resistors that provide isolation between two or more gates of the plurality of silicon-on-insulator transistors.

2. The silicon-on-insulator wafer of claim 1 wherein the dielectric is formed in a focused ion beam etched region.

3. The silicon-on-insulator wafer of claim 1 wherein the dielectric is formed in a deep trench region.

4. The silicon-on-insulator wafer of claim 1 wherein at least one silicon-on-insulator transistor of the plurality of silicon-on-insulator transistors is arranged as a switch.

5. The silicon-on-insulator wafer of claim 1 wherein only a portion of the silicon-on-insulator wafer includes the broken silicon substrate.

6. The silicon-on-insulator wafer of claim 1 wherein the broken silicon substrate extends across an entirety of the silicon-on-insulator wafer.

7. The silicon-on-insulator wafer of claim 1 wherein the silicon-on-insulator wafer includes two or more breaking patterns for breaking the silicon substrate.

8. A packaged radio frequency module comprising:

a package substrate; and a silicon-on-insulator die attached to the package substrate, the silicon-on-insulator die including a silicon substrate broken into two or more substrate regions by a dielectric, the two or more substrate regions including a plurality of islands that are laterally isolated from one another on all sides by the dielectric, the silicon-on-insulator die further including a buried oxide layer formed over the silicon substrate, and an active silicon layer formed over the buried oxide layer and including a plurality of silicon-on-insulator transistors, the plurality of islands forming a plurality of isolation resistors that provide isolation between two or more gates of the plurality of silicon-on-insulator transistors.

9. The packaged radio frequency module of claim 8 wherein the dielectric is formed in a focused ion beam etched region.

10. The packaged radio frequency module of claim 8 wherein the dielectric is formed in a deep trench region.

11. The packaged radio frequency module of claim 8 wherein at least one silicon-on-insulator transistor of the plurality of silicon-on-insulator transistors is arranged as a switch.

12. The packaged radio frequency module of claim 8 wherein the silicon-on-insulator die includes two or more breaking patterns for breaking the silicon substrate.

13. The packaged radio frequency module of claim 8 wherein only a portion of the silicon-on-insulator die includes the broken silicon substrate.

14. A method of processing a silicon-on-insulator wafer, the method comprising:

forming a buried oxide layer formed over a silicon substrate;

forming an active silicon layer over the buried oxide layer, the active silicon layer including a plurality of silicon-on-insulator transistors; and breaking the silicon substrate into two or more substrate regions separated by a dielectric, the two or more substrate regions including a plurality of islands that are laterally isolated from one another on all sides by the dielectric, the plurality of islands forming a plurality of isolation resistors that provide isolation between two or more gates of the plurality of silicon-on-insulator transistors.

15. The method of claim 14 wherein the silicon-on-insulator wafer includes two or more breaking patterns for breaking the silicon substrate.

16. The method of claim 14 further comprising forming at least one silicon-on-insulator transistor of the plurality of silicon-on-insulator transistors as a switch.

17. The method of claim 14 wherein breaking the silicon substrate includes etching a bottom surface of the silicon substrate using a focused ion beam, and filling the etched silicon substrate with the dielectric.

18. The method of claim 14 wherein breaking the silicon substrate includes forming a plurality of deep trenches in a top surface of the silicon substrate, and filling the plurality of deep trenches with the dielectric.

19. The method of claim 14 wherein the broken silicon substrate extends across an entirety of the silicon-on-insulator wafer.

20. The method of claim 14 wherein only a portion of the silicon-on-insulator wafer includes the broken silicon substrate.

* * * * *